United States Patent
Ren et al.

(10) Patent No.: US 9,543,981 B2
(45) Date of Patent: Jan. 10, 2017

(54) CRC-BASED FORWARD ERROR CORRECTION CIRCUITRY AND METHOD

(71) Applicant: Texas Instruments Incorporated, Dallas, TX (US)

(72) Inventors: Jing-Fei Ren, Plano, TX (US); Manish Goel, Plano, TX (US); Yuming Zhu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 133 days.

(21) Appl. No.: 14/224,960

(22) Filed: Mar. 25, 2014

(65) Prior Publication Data

US 2015/0278008 A1    Oct. 1, 2015

(51) Int. Cl.
*H03M 13/00* (2006.01)
*H03M 13/09* (2006.01)
*H04L 1/00* (2006.01)

(52) U.S. Cl.
CPC ............ *H03M 13/09* (2013.01); *H04L 1/0041* (2013.01); *H04L 1/0045* (2013.01)

(58) Field of Classification Search
CPC ...... H03M 13/09; H04L 1/0045; H04L 1/0041
See application file for complete search history.

(56) References Cited

U.S. PATENT DOCUMENTS

| | | | |
|---|---|---|---|
| 6,061,820 A * | 5/2000 | Nakakita | H03M 13/2915 370/395.65 |
| 6,640,327 B1 | 10/2003 | Hallberg | |
| 7,577,899 B2 | 8/2009 | Nieto et al. | |
| 2004/0187072 A1* | 9/2004 | Trott | H03M 13/45 714/801 |
| 2006/0242535 A1 | 10/2006 | Barthel et al. | |
| 2007/0033495 A1* | 2/2007 | Bachu | H03M 13/451 714/776 |
| 2008/0288845 A1* | 11/2008 | Tsfati | H03M 13/09 714/748 |

(Continued)

OTHER PUBLICATIONS

"Single Bit Error Correction Implementation in CRC-16 on FPGA" by Sunil Shukla et al., 2004 IEEE, pp. 319-322.

(Continued)

*Primary Examiner* — April Y Blair
*Assistant Examiner* — Thien D Nguyen
(74) *Attorney, Agent, or Firm* — John R. Pessetto; Charles A. Brill; Frank D. Cimino (57) ABSTRACT

A CRC (cyclic redundancy check) generator circuit (28) generates a first CRC code based on a message. The CRC code is amended to the message, creating a first data packet. Circuitry transforms the first data packet to a second data packet for suitable transmission. Digital receiver circuitry receives the second data packet. A CRC verification circuit compares a received digital CRC code portion of the second data packet to a calculated digital CRC code portion. A message is presented for processing if no error is detected. A CRC-based FEC (forward error correction) circuit receives the message and calculates a digital CRC code from the verification circuit. When an error is detected, the detected error, based on a determination of whether the detected error affects an even number of bits or an odd number of bits, is corrected.

19 Claims, 6 Drawing Sheets

(56) References Cited

U.S. PATENT DOCUMENTS

| | | |
|---|---|---|
| 2011/0161789 A1 | 6/2011 | Kwak |
| 2012/0182948 A1 | 7/2012 | Huang et al. |
| 2013/0061118 A1 | 3/2013 | Pi |
| 2013/0311848 A1* | 11/2013 | Purohit ................ H04L 1/0057 714/758 |

OTHER PUBLICATIONS

"Correcting Single-bit Errors with CRC8 in ATM Cell Headers" by Bo Lin, Freescale Semiconductor Application Note, Document Number: AN2918, Rev. O, Jun. 2005, pp. 1-12.

"CRC Look-up Table Optimization for Single-Bit Error Correction" by Pan Yun et al, Tsinghua Science and Technology, ISSN 1007-0214, 18/19, vol. 12, No. 5, Oct. 2007, pp. 620-623.

"Cyclic redundancy check", from Wikipedia, the free encyclopedia, pp. 1-16.

\* cited by examiner

CRC-BASED FORWARD ERROR CORRECTION CIRCUITRY AND METHOD

BACKGROUND OF THE INVENTION

The present invention relates generally to forward error correction (FEC) circuitry and techniques which may be added to an existing digital communication system including a transmitter and a receiver including any CRC (cyclic redundancy check) for error detection.

Conventional forward error correction includes use of a FEC encoder (such as BCH or LDPC in the transmitter to add parity bits. The parity bits are sent via suitable media, which may be a noisy data signal channel, along with a data packet. The corresponding receiver uses a matched FEC decoder and parity bits to correct errors introduced during transmission and to recover the data. (BCH codes form a class of cyclic error-correcting codes that are constructed using finite fields. Binary BCH codes that may be used to correct multiple bit errors. Another advantage of BCH codes is the ease with which they can be decoded by an algebraic syndrome decoding process which simplifies the decoder design using small low-power electronics. A low-density parity-check (LDPC) code is a linear error correcting code used in transmitting messages over noisy transmission channels and can allow the noise threshold to be set very close to the theoretical maximum for a symmetric memoryless channel.)

CRC code is widely used in digital receivers for error detection to detect errors caused by noise or interference occurring with corresponding "original" transmitted data signals. If a "CRC check" fails the CRC detection algorithm procedure because at least one data error is detected, a re-transmission by the transmitter is automatically requested. The message then is resent from the transmitter to the receiver until a CRC check "passes" CRC detection procedure with no detected data errors. CRC checks have been proposed for correcting single-bit errors in special circumstances, as indicated in the articles "Correcting single-bit errors with CRC8 in ATM cell header" (by Freescale Semiconductor Corporation), "Single Bit Error Correction Implementation in CRC-16 on FPGA" (by S. Shukla, N. Bergmann), and "CRC Lookup Table Optimization for Single Bit Error Correction" (by P. Yun).

CRC error detection is based on polynomial division. Specifically, a CRC code of length "n" is equal to the mathematical remainder of a message polynomial $M(x)$ that is multiplied by a value $x^n$ and then is divided by a CRC generator polynomial $G(x)$ of order n. In $M(x)$, x is either a 1 or 0, corresponding to the message bit, and the exponent is the order or position of the message bit. An example of a CRC generator polynomial with n=24 is $$G(x)=x^{24}+x^{10}+x^9+x^6+x^4+x^3+x+1.$$

If the division produces a remainder polynomial $R(x)$, then $R(x)$ is equal to the CRC code. The transmitter sends a message $T(x)=M(x) \times x^n+R(x)$. (In other words, the CRC code is attached to the end of the message.) The associated receiver receives message $T(x)$ along with any subsequently introduced error, which may be represented by an error polynomial $E(x)$. If and only if $E(x)$ is not divisible by $G(x)$, the receiver declares the existence of an error which is represented by the error polynomial $E(x)$.

Figure 1A:
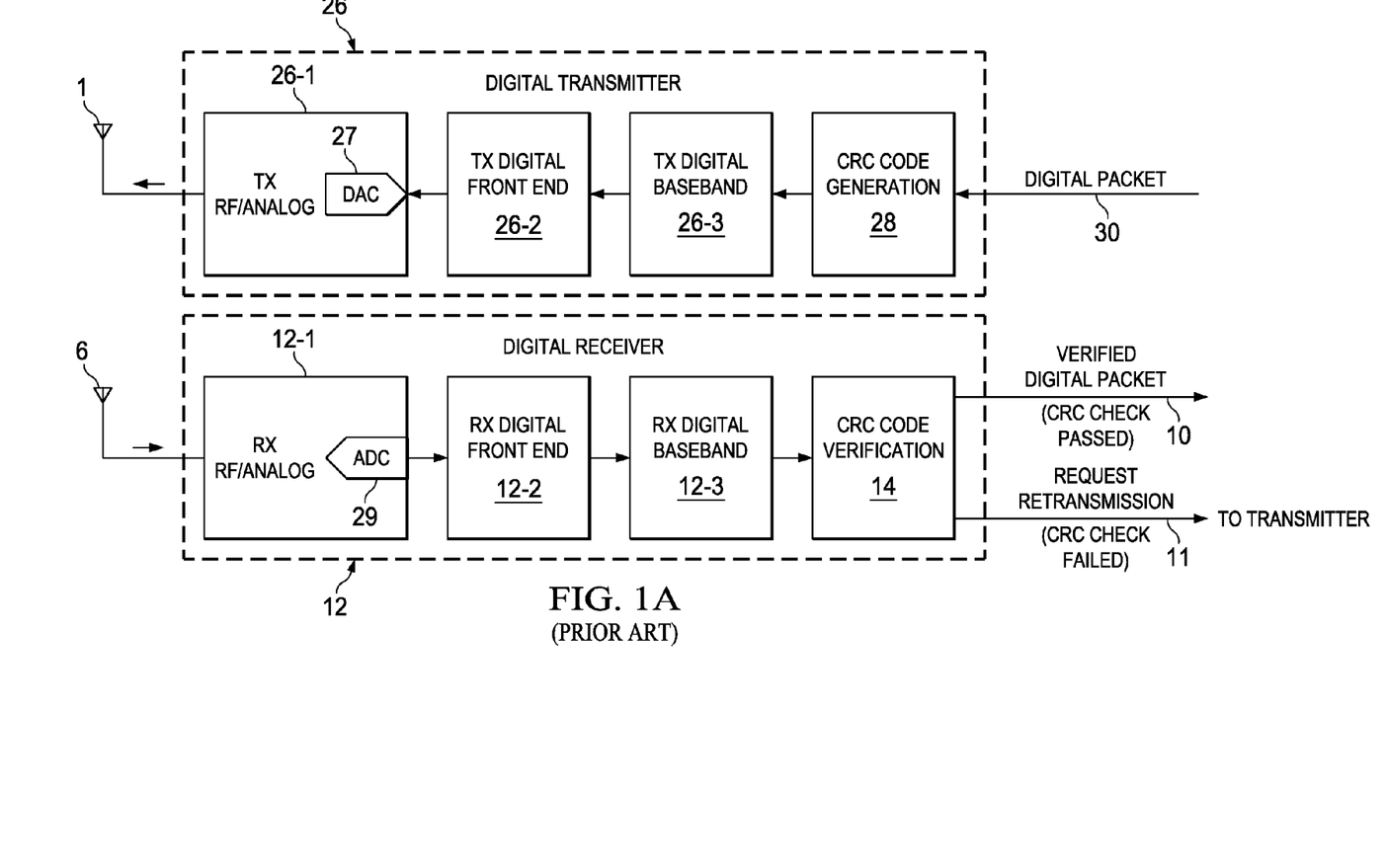
FIG. 1A is a block diagram of a system including a conventional digital transmitter having conventional CRC generation circuitry and a conventional digital receiver including conventional CRC verification circuitry.

Prior Art FIG. 1A shows a communication system including a conventional digital transmitter 26 and a conventional digital receiver 12. Digital transmitter 26 receives a data packet on a signal path 30 which is applied to the input of a CRC generation circuit 28. CRC generation circuit 28 generates a CRC code from the message bits and appends that CRC code to the message on signal path 30. The packet that is composed from the message and the CRC code is applied to an input of a digital transmitter baseband circuit 26-3 which performs the necessary modulation and possible channel coding. There typically is a mapping or transformation of the bits (i.e., 0's and or 1's) into "symbols" in transmitter digital baseband circuit 26-3. The output of digital transmitter baseband circuit 23-3 is applied to the input of a digital transmitter front end circuit 26-2 which includes various filters for meeting predetermined spectrum requirements. The output of digital transmitter front end circuit 26-2, which includes groups of bits (e.g., in hexadecimal format) representing the symbols, is applied to a digital to analog converter (DAC) 27, the output of which is coupled to an input of an RF analog transmitter circuit 26-1 which generates an RF signal representative of the information in the data packet, including the message, the appended CRC code, and any errors that have been introduced. The analog output of DAC 27 is input into transmitter RF analog circuit 26-1 which converts them to RF signals and transmits the RF signals via antenna 1. That is, the transmitter analog RF circuitry in block 26-1 modulates the analog output of DAC 27 to represent the analog information generated by DAC 27 in a high frequency RF format which then is transmitted via antenna 1 over the air or other suitable media.

Digital receiver 12 includes an RF analog receiver circuit 12-1 which receives the RF signal transmitted by digital transmitter 26 via receiver antenna 6 or other suitable media and then demodulates the received RF signal and applies the resulting demodulated signal to the input of an analog to digital converter (ADC) 29. The output of ADC 29 is applied to the input of a receiver digital front end circuit 12-2 which includes various noise-reducing filters. The output of receiver digital front end circuit 12-2 is applied to the input of a receiver digital baseband circuit 12-3 which performs demodulation of the signal received from digital baseband circuit 12-3 and possible channel decoding. Thus, the transmitted RF signal is received by antenna 6 of digital receiver 12, and the reverse of the functions performed by circuits 26-1, 26-2, 26-3 in digital transmitter 26 are performed in blocks 12-1, 12-2, and 12-3, respectively, of digital receiver 12. More specifically, the received RF signal is down-converted into an intermediate frequency (IF) signal which then passes through to various filters in receiver digital front end circuit 12-2 to reduce noise. Then the represented symbols are mapped or transformed to binary 1's and 0's by receiver digital baseband circuit 12-3. The foregoing circuitry and the transmission media may introduce errors into the digital information, so the information in the receiver digital baseband circuit 12-3 may be erroneous.

The output of receiver digital baseband circuit 12-3 is applied to the input of a CRC code verification circuit 14 which operates to calculate the CRC from the received message bits and compare a "received CRC code" with a "calculated CRC code", and any mismatch indicates the existence of one or more errors in the received CRC bits being tested. The receiver 12 has "knowledge" of the "boundary" of the message and the appended CRC, either from the message length field embedded in the message or on the basis of a predetermined "agreement" between transmitter and receiver regarding the message length. If the "received CRC code" and the "calculated CRC code" match, the CRC check test is "passed", and the entire data packet is sent for additional processing by a user application. However, if the calculated CRC code and the received CRC code do not match, i.e., if the CRC check test is "failed", then CRC code verification circuit 14 automatically sends a request to transmitter 26 asking it to retransmit the original data packet.

Unfortunately, such retransmissions add delay to the communication, consume additional power in both the transmitter and receiver, and waste channel bandwidth. Furthermore, there typically is a limit to the number of the retransmissions that are allowed. When that limit is reached, the connection established between the transmitter and receiver may be terminated, in which case that connection would need to be restarted, thereby incurring further communication overhead between the transmitter and receiver. For example, in a BLE (Bluetooth low energy) system, if an error is detected the receiver automatically requests the transmitter to resend the data packet as indicated by reference numeral 11 in CRC code verification circuit 14 in Prior Art FIG. 1A.

The overhead of the prior art techniques (for example as shown in above-described FIG. 1A and subsequently described FIGS. 1B and 1C), in terms of delay, power consumed in the transmitter and the receiver, and limitation of channel capacity due to the above-mentioned retransmission of erroneously received packets detected by CRC, may be reduced by introducing error correction capability using the same CRC code that is originally for error detection. Nearly all systems that include a conventional digital transmitter and a conventional digital receiver (generally as shown in Prior Art FIG. 1A) include CRC code generation in both the transmitter and the receiver as part of any error detection system they may have. It should be appreciated that error "detection" involves determining if a received data packet includes any errors, but such error detection does not include "correction" of any errors that may be present in the received data packet.

A message includes a group of bits to be transmitted, and typically includes a "payload" and a control section called the "header" which includes information identifying the receiver and indicating how many bits are in the message. The payload is the message information intended to be received by a user or an application. The CRC code typically is appended or attached to the end of the message. (The term "message" is used herein to refer the bits that need to be sent from the transmitter to the receiver and the term "packet" or "data packet" is used to refer to the message along with the appended CRC. The message consists of the header and the payload.) The CRC code, or simply "CRC", typically is generated as the remainder resulting from division of a message polynomial M(x) multiplied by a value $x^n$ and then divided by a CRC generator polynomial G(x). Typically, the CRC generator polynomial is a 16-bit, 24 bit, or 32 bit polynomial, depending on how "strong" or accurate the desired error detection capability should be, and may be generated using a linear feedback shift register LFSR. In Prior Art FIG. 1A, the entire data packet, including the appended CRC code, passes from CRC generator circuit 28 into transmitter digital baseband circuit 26-3.

Figure 1B:
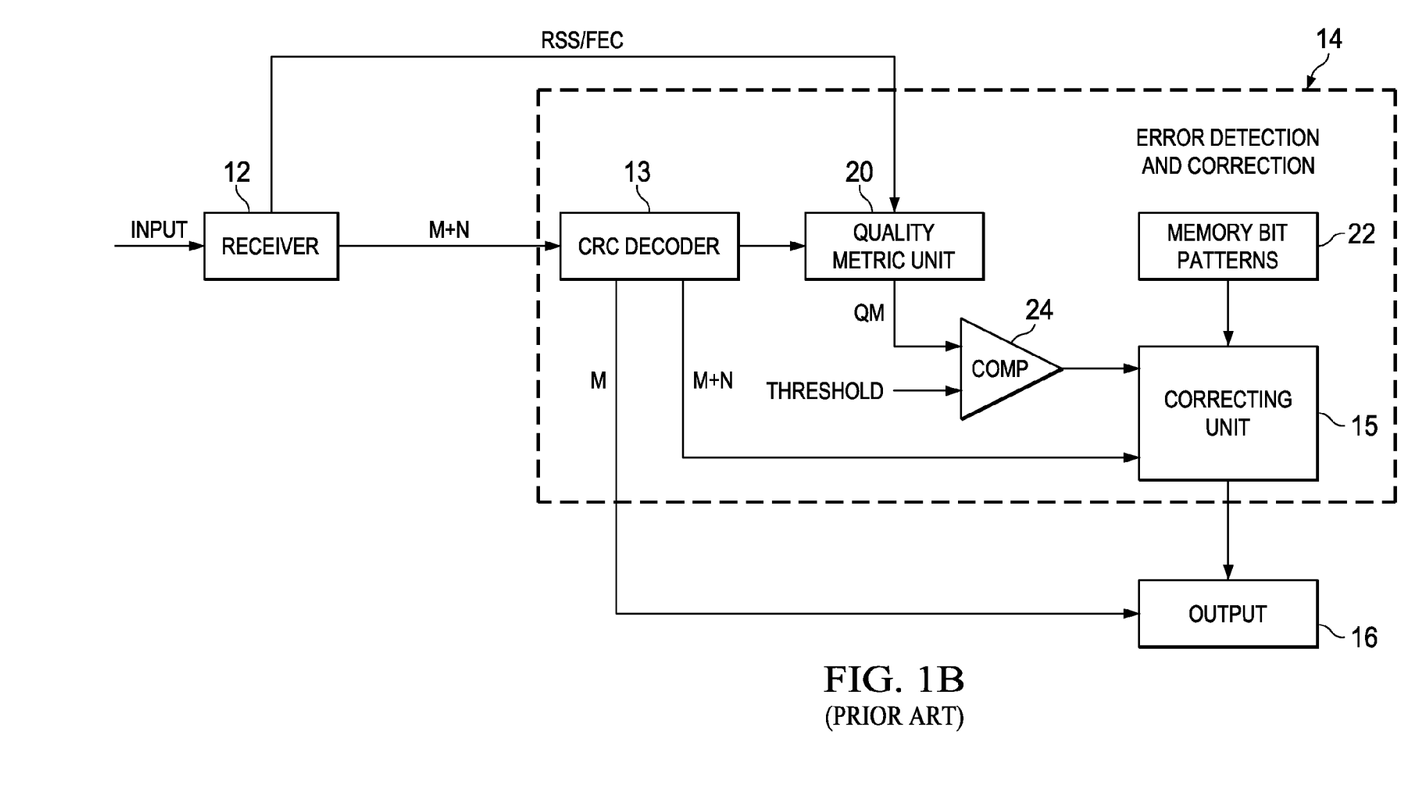
FIG. 1B is a more detailed block diagram of a conventional system including CRC error correction as shown in FIG. 2 of U.S. Pat. No. 7,577,899.

Prior Art FIG. 1B shows a specific way of implementing both error detection and error correction in a receiver of a transmitter-receiver pair, and is a replica of FIG. 2 of U.S. Pat. No. 7,577,899 entitled "Cyclic Redundancy Check (CRC) Based Error Correction Method and Device" issued Aug. 18, 2009 to Nieto et al., and incorporated herein by reference. The following description of Prior Art FIG. 1B corresponds to the description of FIG. 2 in the Nieto et al. patent.

Referring to Prior Art FIG. 1B, the error detection and correction block 14 may include a CRC decoder 13 for performing the CRC and forwarding the M message bits to the output 16 if the CRC passes. If an error is detected, a "quality metric unit" 20 assigns a quality metric to each of the N message bits and M CRC bits, and error detection and correction block 14 may further include a comparator 24 to compare the assigned quality metrics to a threshold to select the K bits. The assigned quality metric may be based upon at least one of a Received Signal to Noise Ratio (RSNR) and a Forward Error Correction (FEC) confidence value, for example, provided by the input/receiver 12. The threshold or RSNR can be used to change the number of bits for correction.

Error detection and correction block 14 may include a memory 22 and/or table to store the possible bit error patterns which are preferably single-bit error patterns. Error detection and correction block 14 may determine whether a multiple-bit error has occurred in the N message bits and M CRC bits of the received message based upon at least the M CRC bits and further based upon a failure to match the CRC value with the single-bit error patterns. Error detection and correction block 14, via correction unit 15, corrects the single-bit errors based upon the single bit-error patterns, and corrects the multiple-bit errors based upon a logical combination of a plurality of single-bit error patterns. Single-bit errors may be corrected without reference to the K bits and quality metrics.

One aspect of Prior Art FIG. 1B is the pre-calculation of CRC bits for different single-bit error patterns. The total number of bits transmitted is N+M, N message bits plus M CRC check bits. An N+M element look-up table, e.g. in the memory 22, is used. The index of the look-up table is the position of the single error in the transmitted bit stream. The table element contains the M bit CRC check that would result at the receiver if a bit error was made at that position. The resulting received CRC is checked against all elements of the table to determine if the received bit stream is suffering from a single bit error in any of the positions. A more elaborate approach, described in the '899 patent, utilizes received bit quality metrics combined with the table to determine the most likely error patterns. Quality metrics for different bits that need to be corrected can be added together to determine the cost of correction, and with a comparison to a threshold, it can be determined whether the cost is too high. If so, the error pattern would not be corrected with the approach described herein.

Note that CRC error detection does not itself include error correction. In Prior Art FIG. 1B, the output of receiver 12 corresponds to the output of the receiver digital baseband circuit 12-3 in Prior Art FIG. 1A. The CRC decoder 13 in FIG. 1B decodes the CRC code that was transmitted by the transmitter, and compares it with a quality metric generated by quality metric unit 20. If there is a mismatch, then the system of FIG. 1B attempts to correct the detected error causing the mismatch. The quality metric takes that along with reliability information into account in comparing the received CRC code with the calculated CRC code to determine possible ways the error can occur. The comparison by comparator 24 in FIG. 1B is performed on the basis of groups of CRC code bits. If there is a match of the calculated and received CRC bits each time, it is assumed that the receiver received the bits correctly. Output block 16 can be a buffer that may contain the corrected digital output packet, and it may include multiple erroneous bits. If that is the case, correcting unit 15A reverses or "flips" the states of the erroneous bits, respectively, in order to make the needed corrections.

The technique of FIG. 1B (which is a copy of FIG. 2 of U.S. Pat. No. 7,577,889) relies on the quality metric associated with individual message bits in the digital receiver to identify possible error locations. Unfortunately, the quality metric is generally not a good indicator of error locations in modern digital receivers that typically utilize available maximum likelihood estimation types of algorithms in the demodulation process. As a result, error correction performance in the system shown in above described Prior Art FIG. 1B and described in U.S. Pat. No. 7,577,899 is quite limited.

For facilitating discussion of a system into which the subsequently described invention can be added, a system using the Bluetooth Low Energy standard is used as an example. (The present invention introduces a new way of using the existing CRC capability originally provided in the system transmitter for error detection to further accomplish error correction in the system receiver.) Those skilled in the art know that "Bluetooth" is a registered brand/trademark/certification mark for various wireless communication standards referred to herein as Bluetooth standards. The various Bluetooth standards have been developed and promulgated by the Bluetooth Special Interest Group known as "Bluetooth SIG". The various brands/trademarks/certification marks are owned and licensed to various users by Bluetooth SIG., Inc. for use on and in conjunction with various communication devices. Up-to-date Bluetooth guidelines can be obtained from the Bluetooth SIG, Inc. website "https//www.bluetooth.org/en-us". Proper authorized use of the Bluetooth brands, trademarks, and certification marks is enforced by Bluetooth SIG, Inc. to ensure that the standards are properly adhered to in accordance with the Bluetooth licensing terms and guidelines.

The Bluetooth Low Energy (BLE) brand/standard/certification mark is now called "Bluetooth Smart". The standard called "Bluetooth 4.0" incorporates the BLE or Bluetooth Smart standard. The term "classic Bluetooth" is used herein to refer to all versions of the Bluetooth standards prior to Bluetooth 4.0. All of the Bluetooth standards are developed by building certification standards/programs around certain parts of the IEEE 802.15.x family of specifications.

A "piconet" is basically a collection of slave/advertisers that are scanned by a master/scanner that could wirelessly connect to another piconet. A "scatternet" is a type of ad-hoc computer network consisting of two or more piconets. The terms "scatternet and "piconet are typically applied to Bluetooth wireless technology. Bluetooth Low Energy (BLE) is a feature of Bluetooth 4.0 wireless radio technology aimed principally at low-power and low-latency applications for wireless devices with a short range, up to approximately 160 feet, and facilitates a wide range of applications.

Figure 1C:
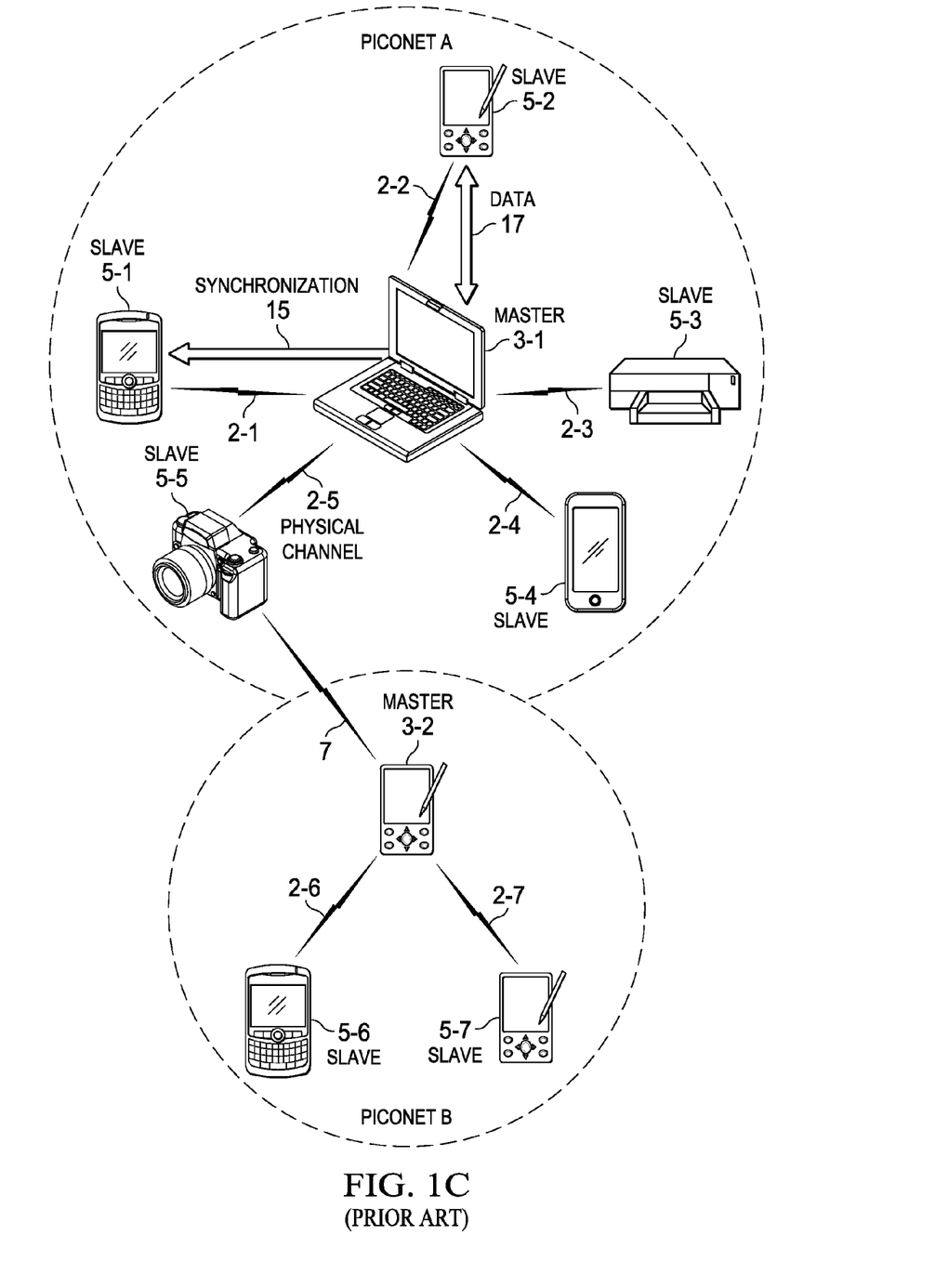
FIG. 1C is a diagram of a conventional low-power Bluetooth (BLE) system.

"Prior Art" FIG. 1C shows a conventional BLE scatternet including a piconet A and a piconet B each including a "master" or "master/scanner" device capable of wireless communication with a number of nearby "slave" or "slave/advertiser" devices. Bluetooth low energy (BLE) is the lowest power standard, and using BLE for the advertising of slave devices in a piconet provides the lowest known power consuming mechanism within the BLE standard. If it is desired to have the lowest power radio standard presently available, BLE is considered to be the starting point.

In piconet A, master/scanner 3-1 is capable of wireless communication with advertisers 5-1, 5-2, 5-3, 5-4, and 5-5 through wireless links 2-1, 2-2, 2-3, 2-4, and 2-5, respectively. Similarly, in piconet B, master/scanner 10-2 is capable of wireless communication with/advertisers 5-6 and 5-7 through wireless links 2-6 and 2-7, respectively. Slave/advertiser 5-5 in piconet A also communicates with master 10-2 in piconet B through wireless link 7. In piconet A, master/scanner 3-1 can synchronize with any of the slave/advertisers in piconet A, for example as represented by reference numeral 15, to establish wireless link 2-1. After synchronization, master/scanner 3-1 then may perform two-way wireless data communication with the slave/advertiser, for example as represented by reference numeral 17.

In the prior art BLE systems in which each slave can generate a payload of a data packet and communicate with a single master or scanner, each slave typically also generates a CRC code that is included in the data packet. That CRC code is used for error detection, but a retransmission occurs every time an error is detected because no error correction is performed. This is inefficient from the viewpoints of power consumption and bandwidth. In addition, connection between the BLE slave unit and associated BLE master or scanner unit needs to be reestablished if such a retransmission also fails the CRC code check. Note that retransmission is costly in terms of power in both transmitter and receiver and in terms of increased delay. The delay is the amount of time from when the packet is first generated at the transmitter to the time the data packet is correctly received. Therefore, significant benefits could be achieved if it were possible and practical to introduce FEC capability into a BLE receiver using the CRC code that is already specified for error detection in the standard. Such benefits in speed/reliability performance and power reduction would save the substantial amount of RF power otherwise required for retransmissions by both the BLE masters and slaves.

In addition to BLE systems, there is in general an unmet need for a way to provide error correction capability in various communication systems including a transmitter and a receiver that may include error detection capability using CRC-based FEC error correction capability.

There also is an unmet need for a way to provide error correction capability in a communication system including a transmitter and a receiver that may include error detection capability but does not have CRC-based FEC error correction capability, without requiring a FEC encoder or a FEC decoder or circuitry for inserting extra parity bits into the transmitted data packets.

There also is an unmet need for a way to provide error correction capability in a communication system including a transmitter and a receiver that may include error detection capability but does not have CRC-based FEC error correction capability, without increasing the bandwidth of the communication system.

There also is an unmet need for a way to provide error correction capability in a communication system including a transmitter and a receiver that may include error detection capability but does not have CRC-based FEC error correction capability, without increasing system speed, and without increasing system power consumption.

There also is an unmet need for a way to provide error correction capability in a communication system including a transmitter and a receiver that may include error detection. capability but does not have CRC-based FEC error correction capability, and is suitable for use in a BLE communication system.

There also is an unmet need for a way to provide error correction capability in a communication system including a transmitter and a receiver that may include error detection capability but does not have CRC-based FEC error correction capability, without increasing latency due to message retransmissions necessitated by detected but uncorrected bit errors.

SUMMARY OF THE INVENTION

It is an object of the invention to provide a way to provide error correction capability in a communication system including a transmitter and a receiver that may include error detection capability but does not have CRC-based FEC error correction capability.

It is another object of the invention to provide a way to provide error correction capability in a communication system including a transmitter and a receiver that may include error detection capability but does not have CRC-based FEC error correction capability, without requiring an FEC encoder for inserting extra FEC parity bits into the transmitted data packets.

It is another object of the invention to provide error correction capability in a communication system including a transmitter and receiver that may include error detection capability but does not have CRC-based FEC error correction capability, without increasing the bandwidth of the communication system.

It is another object of the invention to provide error correction capability in a communication system including a transmitter and a receiver that may include error detection capability but does not have CRC-based FEC error correction capability, which is suitable for use in a BLE communication system.

It is another object of the invention to provide error correction capability in a communication system including a transmitter and a receiver that may include error detection capability but does not have CRC-based FEC error correction capability, without increasing delay due to message retransmissions necessitated by detected but uncorrected bit errors.

It is another object of the invention to provide error correction capability in a communication system including a transmitter and a receiver that may include error detection capability but does not have CRC-based FEC error correction capability, without changing the transmitted signal specified by a standard such as the BLE standard.

Briefly described, and in accordance with one embodiment, the present invention provides a communication system which includes digital transmitter circuitry (26) including a CRC (cyclic redundancy check) generator circuit (28) for receiving a message and generating a first CRC code based on the message and appending the first CRC code to the message to provide a first data packet, and circuitry (26-1,2,3) for transforming the message and the first CRC code in the first data packet to provide a second data packet and transmitting it. Digital receiver circuitry (120) includes circuitry (12-1,2,3) for receiving the second data packet, a CRC verification circuit (14-1) for comparing a received digital CRC code portion of the second data packet to a calculated digital CRC code portion of the second data packet including any error introduced into the received second data packet by the digital transmitter circuitry or by the digital receiver circuitry to detect the existence of any error in the second data packet, and presenting the message for further processing if no error is detected, and a CRC-based FEC (forward error correction) circuit (14-2) for receiving the message portion and the calculated digital CRC code portion from the CRC verification circuit if an error is detected, operating on the message portion to correct the detected error, and indicating that the error is uncorrectable if the correction is unsuccessful.

In one embodiment, the invention provides a communication system (100) including digital transmitter circuitry (26) including a CRC (cyclic redundancy check) generator circuit (28) for receiving a message (30) and generating a first CRC code based on the message (30) and appending the first CRC code to the message (30) to provide a first data packet, and circuitry (e.g., 27,27-1,26-2,26-3) for transforming the message and the first CRC code in the first data packet to provide a second data packet in a form suitable for transmission and for transmitting the second data packet. Digital receiver circuitry (120) includes circuitry (e.g., 12-1, 2,3) for receiving the transmitted second data packet, a CRC verification circuit (14-1) for comparing a received digital CRC code portion of the second data packet to a calculated digital CRC code portion of the second data packet including any error introduced into the received second data packet by the digital transmitter circuitry (26) or by the digital receiver circuitry (120) in order to detect the existence of any error in the second data packet, and presenting the message. A CRC-based FEC (forward error correction) circuit (14-2) receives the message portion and the calculated digital CRC code portion from the CRC verification circuit (14-1) if an error is detected, operates on the message portion to attempt to correct the detected error, and indicates that the error is uncorrectable if the attempt to correct that error is unsuccessful.

In one embodiment, the comparing includes performing an exclusive OR function on the received digital CRC code portion of the second data packet to the calculated digital CRC code portion of the second data packet. In one embodiment, the digital transmitter circuitry (26) converts the second data packet to generate an analog RF signal and wirelessly transmits the analog RF signal to the digital receiver circuitry (120). In one embodiment, the digital receiver circuitry (12) converts digital symbols represented by a received analog RF signal to provide a digital representation of the second data packet.

In one embodiment, the second data packet is transmitted from the digital transmitter circuitry (26) to the digital receiver circuitry (120) by means of a cable (48), wherein the signal is not a non-RF signal.

In one embodiment, the digital transmitter circuitry (26) includes a transmitter digital baseband circuit (26-3) for transforming information in the first digital packet into the digital symbols, and digitizing circuitry (27) for digitizing the digital symbols to prepare them for conversion into the analog RF signal. The digital receiver circuit (120) includes a receiver digital baseband circuit (12-3) for converting the received analog RF signal into a digital signal and operating on that digital signal to recover the digital symbols and convert them into a binary format for the CRC code verification circuit (14-1).

In one embodiment, the CRC generator circuit (28) generates the first CRC code based on a 24-bit generator polynomial G(x). In one embodiment, the generator polynomial is given by the expression $G(x)=x^{24}+x^{10}+x^9+x^6+x^4+x^3+x+1$.

In one embodiment, the CRC-based FEC circuit (14-2) operates to calculate (36) a CRC error syndrome (CRC_SYND) equal to the exclusive OR function of a received CRC (CRC_rcv) and a calculated CRC (CRC_calc), wherein the received CRC (CRC_rcv) is equal to the first CRC code appended to the message (30,M(x)) that is received by the receiver with possible errors and the calculated CRC (CRC_calc) is the remainder from dividing of the message (30,M(x)) by a generator polynomial (G(x)); the CRC-based FEC circuit (14-2) also operates to detect (38) any errors in the message (30,M(x)); if any errors have been detected, the CRC-based FEC circuit (14-2) also operates to determine (40) if the number of detected errors is an even number or an odd number; if the number of detected errors is an even number, the CRC-based FEC circuit (14-2) also operates to compute a syndrome patch (SYND_P) for the even number of detected errors; if the syndrome patch (SYND_P) is equal to 0 (note that SYND_P has the same number of bits as CRC. SYND_P=0 means all bits are equal to '0'), the CRC-based FEC circuit (14-2) also operates to correct a detected error by flipping corresponding bits in the message (30,M(x)), and if the syndrome patch (SYND_P) is not equal to 0, assuming different bits are in error and recalculate SYND_, if SYND_P is not 0 after all possible even number of error candidates are used for patching, the CRC-based FEC circuit (14-2) also operates to indicate (60) that the error is not correctable; if the number of detected errors is an odd number, the CRC-based FEC circuit (14-2) operates to compute a syndrome patch (SYND_P) for the odd number of detected errors; and if the syndrome patch (SYND_P) is equal to 0, the CRC-based FEC circuit (14-2) also operates to correct a detected error by flipping corresponding bits in the message (30,M(x)), and if the syndrome patch (SYND_P) is not equal to 0, SYND_P is recalculated by assuming different odd number of errors. If SYND_P is not equal to 0 after all the odd number of error candidates are used for patching, the CRC-based FEC circuit (14-2) operates to indicate (60) that the error is not correctable.

In one embodiment, the CRC-based FEC circuit (14-2) operates to compute the syndrome patch (SYND_P) equal to the exclusive OR function of the CRC syndrome (CRC_SYND) and a patched value of the CRC syndrome (CRC_SYND) corresponding to a predetermined group of erroneous bits.

In one embodiment, the digital transmitter circuitry (26) is included in a master unit (3-1) in a BLE) Bluetooth low energy) network and the digital receiver circuitry (120) is included in a slave unit (5-1) in the BLE network.

In one embodiment, the invention provides a CRC (cyclic redundancy check) method for accomplishing FEC (forward error correction) in a communication system (100) including digital transmitter circuitry (26) and digital receiver circuitry (120), the method including operating a CRC (cyclic redundancy check) generator circuit (28) in the digital transmitter circuitry (26) on a received message (30,M(x)) to generate a first CRC code based on the message (30), appending the first CRC code to the message (30,M(x)) to provide a first data packet, transforming the message and the first CRC code in the first data packet to provide a second data packet in a form suitable for transmission, and transmitting the second data packet; the method also including operating circuitry (e.g., 12-1,2,3) in the digital receiver circuitry (120) to receive the transmitted second data packet, operating a CRC verification circuit (14-1) to compare a received first digital CRC code portion of the second data packet with a calculated digital CRC code based on a message portion (M(x)) of the second data packet possibly including an error introduced by the digital transmitter circuitry (26) or by the digital receiver circuitry (120) to detect the existence of any error in the message portion of the second data packet, and presenting the message portion (M(x)) of the second data packet for further processing if no error is detected, and operating a CRC-based FEC (forward error correction) circuit (14-2) receiving (32) both the message portion (M(x)) of the second data packet and the first calculated digital CRC code portion from the CRC verification circuit (14-1) if an error is detected to attempt to correct the detected error, and indicating that the detected error is uncorrectable if the attempt to correct it is unsuccessful.

In one embodiment, the comparing includes performing an exclusive OR function on the received first digital CRC code portion of the second data packet to the calculated digital CRC code portion of the second data packet. In one embodiment, the method includes operating the digital transmitter circuitry (26) to transform the second data packet to an analog RF signal, and wirelessly transmitting the analog RF signal to the digital receiver circuitry (120).

In one embodiment, the method includes, if the number of detected errors is an even number, computing a syndrome patch (SYND_P) for the even number of detected errors, and if that syndrome patch (SYND_P) is equal to 0, correcting a detected error by flipping a corresponding bit in the message portion (M(x)) of the second data packet, and if that syndrome patch (SYND_P) is equal not to 0, indicating (60) that detected error is not correctable; and the method includes, if the number of detected errors is an odd number, computing a syndrome patch (SYND_P) for the odd number of detected errors, and if that syndrome patch (SYND_P) is equal to 1, correcting a detected error by flipping a corresponding bit in the message portion (M(x)) of the second data packet, and if that syndrome patch (SYND_P) is equal to 1, indicating (60) that detected error is not correctable.

In one embodiment, the digital transmitter circuitry (26) is included in a master unit (3-1) in a BLE (Bluetooth low energy) network and the digital receiver circuitry (120) is included in a slave unit (5-1) and the method is performed in the BLE network.

In one embodiment, the invention provides a CRC (cyclic redundancy check) system for accomplishing FEC (forward error correction) in a communication system (100) including digital transmitter circuitry (26) and digital receiver circuitry (120), also including CRC (cyclic redundancy check) generating means (28) in the digital transmitter circuitry (26) on a received message (30,M(x)) for generating a first CRC code based on the message (30), appending the first CRC code to the message (30,M(x)) to provide a first data packet, also including means (26-3) for transforming the message and the first CRC code in the first data packet to provide a second data packet in a form suitable for transmission, and means (1,26-2,48) for transmitting the second data packet; means (12-1,2,3) in the digital receiver circuitry (120) for receiving the transmitted second data packet; the CRC system also includes CRC verification means (14-1) in the digital receiver circuitry (120) for comparing a received first digital CRC code portion of the second data packet with a calculated digital CRC code based on a message portion (M(x)) of the second data packet possibly who is including an error introduced by the digital transmitter circuitry (26) or by the digital receiver circuitry (120) to detect the existence of any error in the message portion of the second data packet, and also includes means (10) for presenting the message portion (M(x)) of the second data packet for further processing if no error is detected; the CRC system also includes CRC-based FEC (forward error correction) means (14-2) for receiving (32) both the message portion (M(x)) of the second data packet and the first calculated digital CRC code portion from the CRC verification circuit (14-1) if an error is detected and correcting the detected error and indicating that the detected error is uncorrectable if the correcting is unsuccessful.

DETAILED DESCRIPTION OF THE PREFERRED EMBODIMENTS

Figure 2:
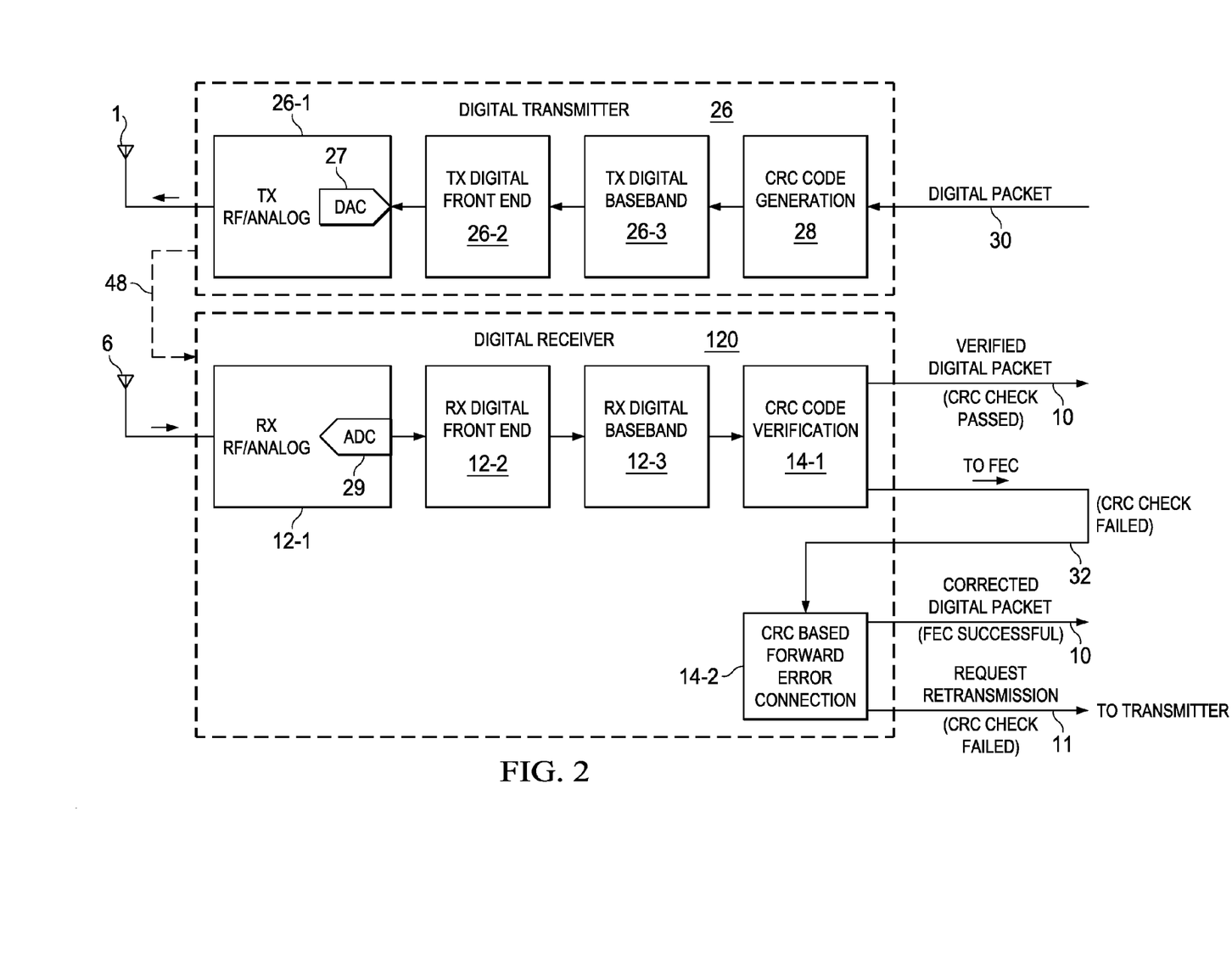
FIG. 2 is a block diagram of a system including a digital transmitter and a digital receiver including CRC generation circuitry, CRC verification circuitry, and CRC-based forward error correction (FEC) in accordance with the present invention.

FIG. 2 shows a communication system including CRC error correction capability that may be incorporated into any conventional communication system which includes a transmitter and a receiver that includes CRC error detection capability but does not include CRC error correction capability. For example, the wireless communication system of FIG. 2 may be incorporated into a conventional BLE system which has no CRC error correction capability, generally as shown in Prior Art FIG. 1A. However, the communication system does not have to be wireless, and the transmitter actually can be coupled to the receiver by means of a cable, for example as indicated by the dashed line 48 extending from an output of a digital transmitter 26 to an input of a digital receiver 120. For example, USB power delivery systems transmit data packets over a cable but can still benefit from CRC-based forward error correction in accordance with the invention described herein. (However, if the transmitter is coupled by a cable to the receiver, then the signal does not need to be an RF signal. As long as the CRC is used in a communication system for error detection, that same CRC may also be used for error correction.)

Figure 4:
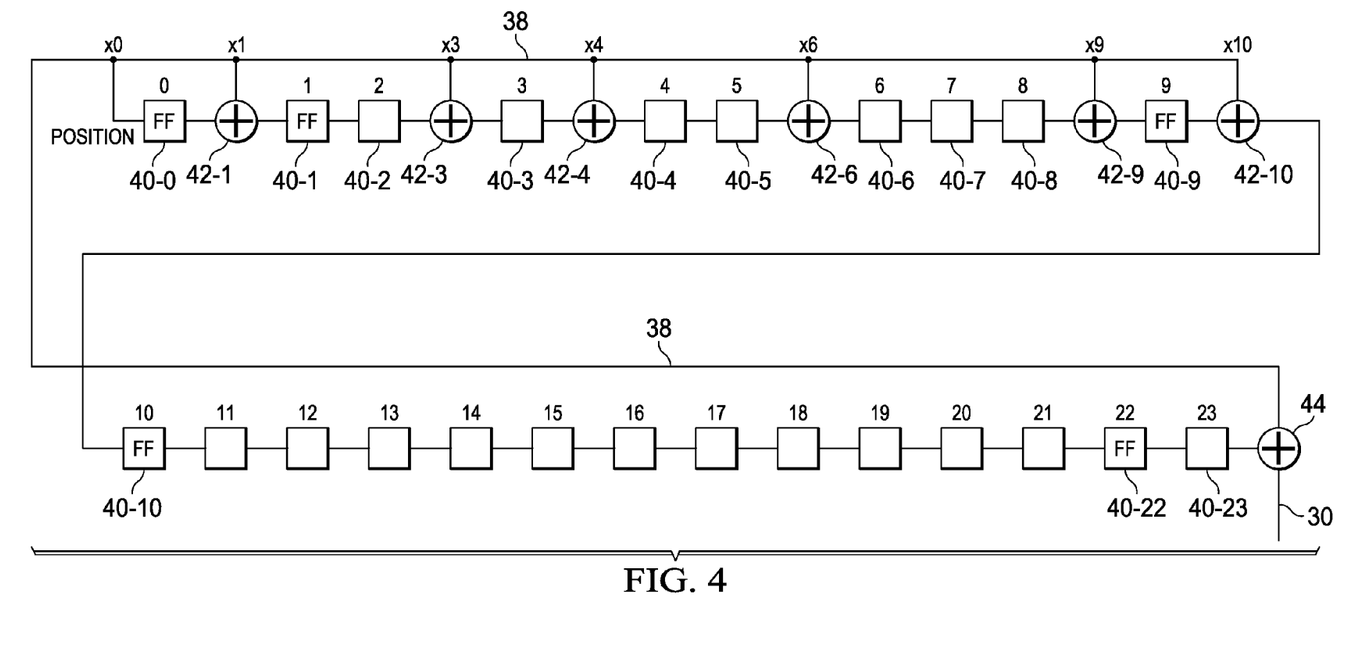
FIG. 4 illustrates a block diagram implementation of a CRC generator polynomial.

The communication system of FIG. 2 includes a conventional digital transmitter 26 and improved but mostly-conventional digital receiver 120. Digital transmitter 26 receives a data packet via a signal path 30 which is applied to the input of a CRC generation circuit 28. As previously mentioned, the data packet referred to herein typically includes a "payload" or "message" and a control section or "header" that also identifies the receiver and the number of bits in the data packet. The CRC code is generated as a mathematical remainder of the division of the message polynomial M(x) and, for every bit in the data packet, that the message polynomial M(x) is multiplied by a value $x^n$ and the result then is divided by a CRC generator polynomial G(x). In this example, the CRC generator polynomial may be the 24 bit polynomial $$G(x)=x^{24}+x^{10}+x^9+x^6+x^4+x^3+x+1,$$

which can be generated by means of the linear feedback shift register (LFSR) shown in subsequently described FIG. 4.

CRC generation circuit 28 generates or calculates a "CRC code" from the message bits and appends that CRC code to the message received on signal path 30. (The "CRC syndrome" is equal to or is the result of the exclusive OR between the calculated CRC code and the received CRC code.) The message content in the initial data packet on signal path 30 is considered to be correct (error-free) when it passes into CRC generator 28. If an error is introduced into the data packet on its way from transmitter digital baseband circuit 26-3 to digital baseband circuit 12-3 in subsequently described digital receiver 120, then the error is detected by CRC code verification circuit 14-1 of digital receiver 120.

The output of CRC generation circuit 28 in digital transmitter 26 in FIG. 2 includes the entire data packet (including the message, the appended CRC code, and other information), and that entire data packet passes into transmitter digital baseband circuit 26-3. Transmitter digital baseband circuit 26-3 performs the function of mapping or transforming or modulation of the bits (i.e., 0's and or 1's) into "symbols". The output of transmitter digital baseband circuit 23-3 is applied to the input of transmitter digital front end circuit 26-2, which includes various filters for meeting predetermined spectrum requirements. The output of digital transmitter front end circuit 26-2, which includes groups of bits (e.g., in hexadecimal format) representing the symbols, is applied to the input of a digital to analog converter (DAC) 27 included in an analog transmitter circuit 26-1 which generates an RF signal representing the entire data packet (including the appended CRC code) to be transmitted via transmitter antenna 1. The transmitter analog RF circuitry in block 26-1 modulates the analog output of DAC 27 to represent the information in a high frequency RF format which is transmitted via antenna 1. Thus, digital transmitter 26 in Fig. may be essentially the same as in Prior Art FIG. 1A.

Digital receiver 120 in FIG. 2 includes a receiver RF analog circuit 12-1 which receives (via antenna 6) the RF signal transmitted by digital transmitter 26, demodulates the received RF signal, and applies the resulting demodulated signal to the input of an analog to digital converter (ADC) 29. The output of ADC 29 is applied to the input of a receiver digital front end circuit 12-2 which includes various noise-reducing filters. The output of digital receiver front end circuit 12-2 is applied to the input of receiver digital baseband circuit 12-3 which performs mapping or transforming or demodulation of the previously mentioned "symbols" or groups of bits into binary bits (i.e., 0's and or 1's). The output of receiver digital baseband circuit 12-3 is applied to the input of a CRC verification circuit 14-1 which operates to calculate (using a known CRC algorithm) the n-bit CRC code appended to the end of the received message and compares the resulting "calculated CRC code" with the "received CRC code". If the "calculated CRC code" matches the "received CRC code", then the CRC check test is "passed" and the entire errorless data packet is sent via signal path 10 to suitable "upper layer" software or circuitry for additional processing, e.g. for use by a user application.

However, as previously indicated, the foregoing circuitry in the data packet signal path and the air interface between transmitter digital baseband circuit 26-3 and receiver digital baseband circuit 12-3 may introduce errors into the received digital message information. Then the CRC check test will be "failed" and the corresponding mismatch between the calculated CRC code and the received CRC code indicates the existence of one or more errors in the received data packet being tested. If the received data packet fails the CRC check, CRC verification circuit 14-1 in FIG. 2 generates an "invoke FEC (forward error correction)" signal on signal path 32, which is provided as an input to a CRC-based FEC circuit 14-2. The information passed from CRC verification circuit 14-1 to CRC-based FEC circuit 14-2 in FIG. 2 includes, in addition to the message bits, the packet length, the received CRC and the calculated CRC. Note that this is in direct contrast to the previously described digital conventional receiver 12 in Prior Art FIG. 1A, wherein CRC verification circuit 14 sends an "automatic resend request (ARQ)" to digital transmitter 26 asking it to resend the original data packet if the calculated CRC code and the received CRC code do not match (i.e., if the CRC check test is "failed" because of the existence of a detected error).

CRC based FEC circuit 14-2 operates in accordance with the FEC flow indicated in the flowchart of subsequently described FIG. 3, and thereby attempts to correct the errors detected by CRC verification circuit 14-1. If successful in correcting the errors, FEC circuit 14-2 then sends the data packet via path 10 to a next stage, which may be an "upper layer" stage for further processing or utilization. If not successful in correcting the errors, FEC circuit 14-2 sends a retransmission request via path 11 to the transmitter.

Thus, digital receiver 120 in FIG. 2 provides a new CRC-based FEC (forward error correction) circuit 14-2. However, it should be understood that not all detected errors can always be corrected, even with CRC-based error correction. If CRC-based FEC circuit 14-2 is unable to correct any detected error, it automatically sends a retransmission request via signal path 11 to digital transmitter 26 (requesting it to retransmit the original data packet).

Figure 3:
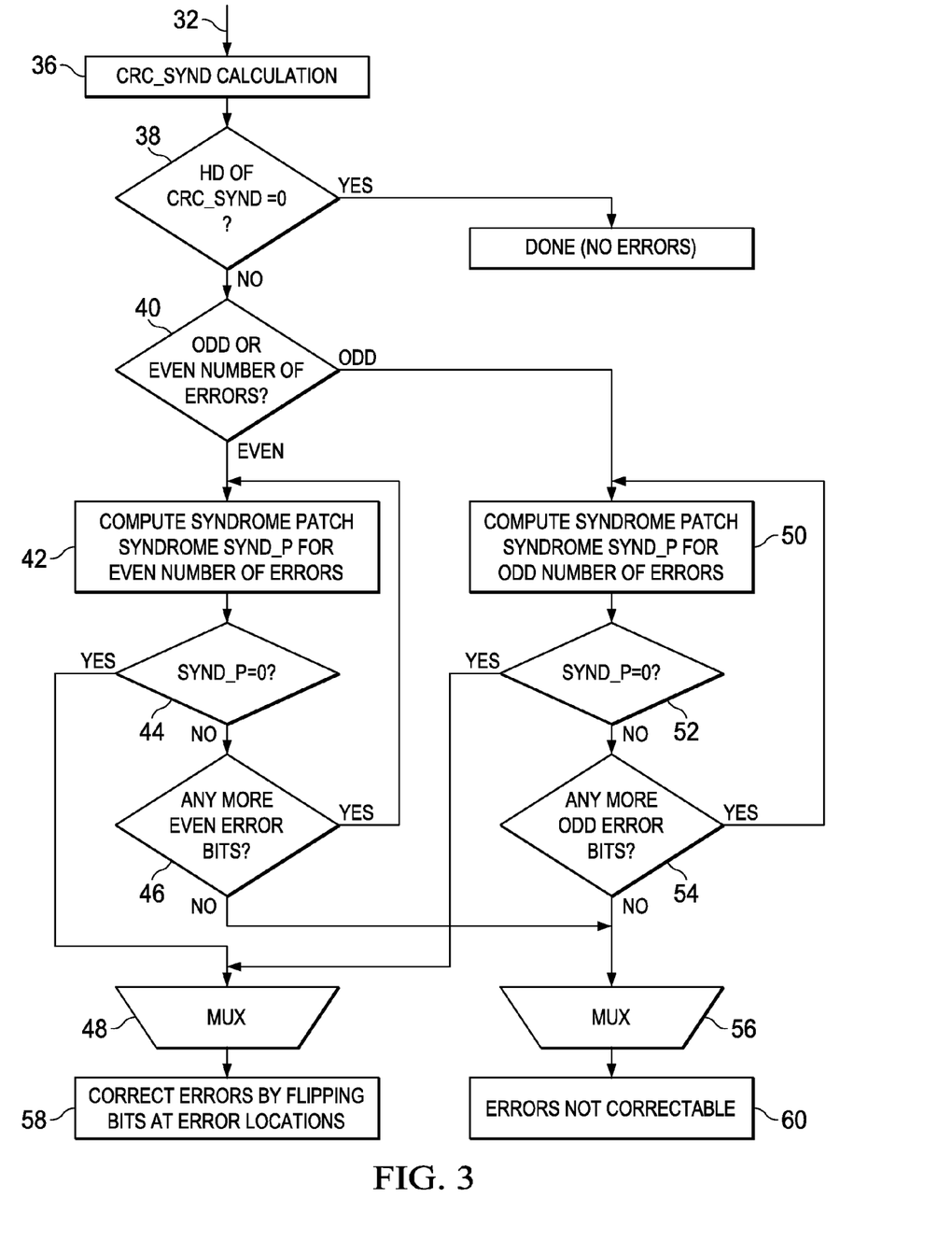
FIG. 3 is a flowchart of the forward error correction process performed in the system of FIG. 2.

Referring next to the flowchart in FIG. 3, the forward error correction performed by CRC-based FEC circuit 14-2 in FIG. 2 begins at signal path 32 (shown in both FIGS. 2 and 3). The output 32 of CRC verification circuit 14-1 is operated upon in block 36 of the FEC program flowchart by an "error syndrome calculator" routine which calculates a "CRC error syndrome" CRC_SYND=CRC_rcv ⊕ CRC_calc by performing an exclusive OR function on the "received CRC" (i.e., CRC_rcv) and the "calculated CRC" (i.e., CRC_calc) to determine the difference between them. The conventional solution only examines to determine whether or not CRC_SYND is equal to 0 in order to determine if there is any error in the packet. However, the CRC error syndrome contains rich information that can be exploited to derive additional properties about the errors, as will be subsequently shown. For example, the CRC error syndrome (i.e., the exclusive OR of the "received CRC" (i.e., CRC_rcv) and the "calculated CRC" (i.e., CRC_calc)) can be used to determine the number of even or odd errors, if any error exists. Furthermore, the CRC error syndrome CRC_SYND can help in determining possible error locations. The value of CRC_calc is calculated in CRC verification circuit 14-1 of digital receiver 120 in essentially the same way as in the calculation by CRC code generation circuit 28 of digital transmitter 12, that is, by dividing the now possibly erroneous message M(x), as it is received from signal path 32, by the same previously mentioned generator polynomial G(x). This can be accomplished by feeding the message portion M(x) of the received data packet on signal path 32 to a LFSR (linear feedback shift register) as shown in subsequently described FIG. 4. The LFSR generates the remainder of the division, which is equal to CRC_calc. The "received CRC" value CRC_rcv is the appended last n-bits of the data packet received on signal path 32 by FEC circuit 14-2.

Next, the FEC program goes to decision block 38 of FIG. 3, and if the Hamming distance of CRC_SYND (denoted by HD(SYND) or simply by "HD") is equal to 0, that means the "calculated CRC" value CRC_calc matches the "received CRC" value CRC_rcv so that the received message is either error-free or contains an error that is not detectable by the CRC being used. (A properly selected CRC should make the probability of an actual error that is not detectable by the CRC extremely low). If the message received on signal path 32 in FIG. 2 is error-free, then the FEC (forward error correction process) is not needed for that particular received message. However if the Hamming distance HD of CRC_SYND is non-zero, then the FEC program of FIG. 3 goes to decision block 40 and determines whether the Hamming distance HD is an even number or an odd number, according to whether the number of detected errors in the present packet is an even number or an odd number, respectively. (The Hamming distance HD of a binary sequence is the sum of all the bits of the binary sequence.) If the number of detected errors is an even number, the FEC program goes to block 42, and if the number of detected errors is an odd number, the FEC program goes to block 50.

In block 42 of FIG. 3, the FEC program determines or computes a "patched CRC error syndrome" SYND_P for the case wherein there is an even number of potentially erroneous bits in the data packet on signal path 32 that are examined for possible errors. The patched CRC error syndrome SYND_P is equal to the exclusive OR function of the original CRC error syndrome value CRC_SYND and the "patched CRC" value corresponding to the group of bits being examined for possible errors. A CRC patch is the CRC of a "patch packet" whose bits are all "0"s except that an even number of bits being considered as possibly erroneous are "1"s. ("Even" or "odd" errors are determined by whether the Hamming Distance of the CRC error syndrome CRC_SYND is an even or odd number.) A CRC patch can be updated very efficiently (for example, once every cycle in a hardware implementation) when the number of bits being examined for possible errors each time is a small number.

From block 42, the FEC program goes to decision block 44 and, if patched CRC error syndrome SYND_P=0, the bits earlier being considered as possibly erroneous are now considered to be actually erroneous, and in that case the "yes" or affirmative decision of block 44 of the FEC program leads via multiplexer 48 to block 58 and corrects the errors by reversing the erroneous bits in the received message, that is, by "flipping" or reversing the value of any erroneous "0" to a "1" and "flipping" or reversing the value of any erroneous "1" to a "0". If the result of decision block 44 is negative, then the FEC program goes to decision block 46 and determines whether there are any more even number error bits in a selected set of an even number of possible error bits. If the determination of decision block 46 is affirmative, the FEC program returns to block 42 and repeats the above-described process. The bits or groups of bits in the patch packet should be systematically examined for possible errors. If the determination of decision block 46 is negative, the error is considered to be uncorrectable. The FEC program then goes via multiplexer 56 to block 60 and indicates that at least some even number of errors in the received data packet is not correctable.

For the case when the number of detected errors in the received message is an odd number, the operation of the FEC program in blocks 50, 52, 54, and 56 is essentially similar to its operation in blocks 42, 44, 46, and 48, respectively.

As an example of using an even number of detected errors in the received message (i.e., using the left branch of the flowchart in FIG. 3), if the FEC is limited to correcting any 2-bit error and any two consecutive 2-bit errors in the received data packet, bits j and k for 2-bit error or bits j and j+1 and bits k and k+1 are considered to be possibly erroneous, respectively. A patched CRC is calculated for each case. If SYND_P for the first case is 0, bits j and k are considered to be erroneous. If SYND_P for the second case is 0, bits j, j+1, k, and k+1 are considered to be erroneous.

The errors are corrected by flipping the bits in positions j and k or positions j, j+1, k, and k+1, respectively, in the received message. If SYND_P is not 0 in either case for a given j and k, a different group of bits is selected by varying j and/or k. If the SYND_P=0 condition is not found after exhausting all the possible combinations of 2-bit errors or two consecutive 2-bit errors, then the error is considered to be uncorrectable. The uncorrectable errors include any 6-bit errors or 4-bit errors that are not located in two consecutive 2-bit positions.

The error correction capability of the method described herein depends on both the particular CRC polynomial used and the length of the data packet for a given communication system. To ensure one-to-one mapping between the CRC error syndrome and the error bit positions, the error bit patterns considered for FEC need to be selected. For example, if an MLSE (Maximum Likelihood Sequence Estimation) decoder is used, errors tend to occur in bursts and the error bit patterns should cover the most common burst errors.

Using BLE as an example, the maximum packet length for BLE (Bluetooth low energy) communication is 39-bytes or 312-bits using the 24-bit CRC generator polynomial $$G(x)=x^{24}+x^{10}+x^9+x^6+x^4+x^3+x+1.$$

If the error correction capability is limited to a maximum 4 bits (which covers most common error patterns), it can be numerically proved that any 1 or 2-bit errors and any 3-bit errors in the received packet that include a consecutive 2-bit error or any 4-bit errors that consist of two consecutive 2-bit errors will have their CRC error syndrome mapped one-to-one to error bit positions. As a result, all these error bit patterns are correctable.

Following is an example of an algorithm that can be used for 2 bit error correction. In the following description, the bit position in a packet is indexed from the last bit in the payload backward. That is, the last payload bit is in position 0 and the second-last bit is in position 1. The LUT function referred to below accesses a look up table of 313 entries that maps a 1-bit error CRC patch value to the corresponding error position. Since any single bit error is correctable in BLE, such a LUT function exists. The CRC patch value corresponding to a single bit error at position "i" can be found by calculating the CRC of a patch packet having all of its bits equal to "0" except for bit position "i" where the bit is equal to "1". In addition to the 312 entries that map a CRC patch value corresponding to the single bit error to the error position, the LUT also has an extra entry that returns "312" if the CRC patch value does not match any of the 312 CRC patch values.

For example, LUT(0x79820)=99. This means if the CRC patch is 0x79820, the data packet contains a single bit error at position 99. However, if LUT of a CRC patch value returns "312", that indicates the CRC patch value is not for a single bit error.

Following is an algorithm to find a 2-bit error:
$P_i(x)=(0x1 \cdot x^n) \% G(x) \oplus CRC\_SYND,$// where "//" is used to denote comments, "%" indicates Modulo2 operation, and "$\oplus$" denotes the exclusive OR function/operation. 0x1% G(x) is the "CRC patch" if bit 0 is in error and $P_i(x)$ is the patched CRC error syndrome corresponding to error in position "i."
For (i=1;i<312:i++) {//assume bit i is in error
$P_i(x)=(P_{i-1}(x) \cdot x) \% G(x)$//find patched CRC error syndrome if bit i is in error
j=LUT($P_i(x)$)//Perform Table Look Up to examine if $P_i(x)$ is for a single bit
If (j<312)//If yes
return i,j//Indeed it finds a two bit error in position i and j.
//Flip bit in the bit positions i and j to correct errors}//move to next bit position
return error_uncorrectable.//not a 2-bit error.

Following is an example of an algorithm for correcting a 4-bit error consisting of two consecutive 2-bit errors:
The LUT2 function refers to a Look Up Table of 312 entries that maps a 2-bit consecutive error CRC error syndrome to the first error bit position of the 2-bit error. The CRC patch value corresponding to a 2-bit consecutive error at position i and i+1 can be found by calculating CRC of a patch packet whose all bits are '0' except bit positions i and i+1 where they are "1". In addition to the 311 entries that map a CRC patch value corresponding to a 2-bit error to the error position, the LUT also has an extra entry that returns "311" if the CRC patch value does not match any of the 311 CRC patch values.

In this example, $P_0(x)=(0x3 \cdot x^n) \% G(x) \oplus CRC\_SYND,$// where "%" indicates modulo2 operation and $\oplus$ denotes the exclusive OR operation and function/. 0x3% G(x) is the CRC patch if bits 0 and 1 are in error and $P_0(x)$ is the corresponding patched CRC syndrome.
For (i=1;i<309:i++) {//assume bit i and i+1 are in error
$P_i(x)=(P_{i-1}(x) \cdot x) \% G(x)$//find patched CRC error syndrome if bit i and i+1 are in error
j=LUT2($P_i(x)$)//Perform Table Look Up to examine if $P_i(x)$ is for a consecutive 2-bit error.
If (j<311)//If yes
return i,j//Indeed there exists a two consecutive 2-bit errors at position i, i+1 and j, j+1.
/Flip bits in i,i+1 and j, j+1 to correct errors/}//move to next bit position return error_uncorrectable.//not a two consecutive 2-bit error.

The algorithms for 2-bit and 4-bit errors can be combined. They can be implemented in hardware by using small look-up tables and simple logic to complete the LUT search process. The LUT search process 312 cycles in the worst case. If only single-bit and single-burst errors need to be corrected, the LUT is not needed, further simplifying the design. The algorithms for an odd number of error bits can be constructed similarly and may share the hardware used for the case of an even number of error bits. The error correction can be extended to cover the CRC bits. For example, for single bit error, if the Hamming distance of CRC_synd is 1, it indicates the error is in the received CRC. For 2-bit errors, if Hamming distance of a patched CRC error syndrome patched for single bit error at position "i" is 1, there is one bit error in position "i" of the payload and one bit error in the received CRC.

FIG. 4 shows a hardware implementation of a LFSR (linear feedback shift register) 33 which can generate the previously mentioned 24-bit CRC generator polynomial $$G(x)=x^{24}+x^{10}+x^9+x^6+x^4+x^3+x+1.$$

LFSR 33 includes 24 series-connected flip-flops 40-0,1,2 . . . 23. 24 bits of the Data In signal on conductor 30 in FIG. 2, are serially fed (LSB first) into one input of an exclusive OR circuit 44 having its other input connected to the output of flip-flop 40-23 and having its output connected by conductor 38 to one input of each of exclusive OR circuits 42-1, 42-2, 42-4, 42-5, 42-7, and 42-10. Conductor 38 also is connected to the input of flip-flop 40-0. The other inputs of exclusive OR circuits 42-1, 42-2, 42-4, 42-6, 42-9, and 42-10 are connected to the outputs of flip-flops 40-0, 40-2, 40-3, 40-5, 40-8, and 40-9, respectively. The outputs of exclusive OR circuits 42-1, 42-2, 2-4, 42-6, 42-9, and 42-10 are connected to the inputs of flip-flops 40-1, 40-3,

40-4, 40-6, 40-9, and 40-10, respectively. (The precise structure and operation of various implementations of LFSR 33 will be apparent to those skilled in the art.)

The described CRC based FEC (forward error correction) system provides a way to provide error correction capability in a communication system including a transmitter and a receiver that do not have error correction coding capability and do not require use of extra parity bits. This FEC system avoids or reduces message re-transmission costs associated with both the transmitter and the receiver, and also avoids increased latency due to message re-transmission. Increased speed and decreased power consumption are achieved with no need to increase bandwidth of the communication system. Therefore, the invention is suitable for use in a BLE communication system. Furthermore, the described CRC based FEC system works well for most CRC decoding algorithms, and operates only when errors are detected so that there is no spectrum overhead or power overhead when no errors are present.

To summarize, when a data packet is received, the CRC code is calculated by the receiver from the received bits. If the received CRC code and the calculated CRC code do not match, then the data packet is erroneous. Thus, for error detection purposes it is only necessary to check if there is any mismatch between the calculated CRC and the received CRC, because any mismatch indicates an error either in the received packet payload or the received CRC or both. If a mismatch occurs, the difference between the calculated CRC and received CRC contains information that may be used to correct errors. The CRC error syndrome is defined by the expression $$CRC\_SYND = CRC\_rcv \oplus CRC\_calc,$$

where $\oplus$ represents the exclusive OR function.

If the Hamming distance HD of the CRC error syndrome CRC_SYND is equal to 0, either there is no error or any existing error is not detected by the CRC error detection process. However, if the Hamming distance HD is non-zero, then, if the Hamming distance HD of CRC_SYND is an odd number, that indicates there are an odd number of errors in the received packet. Otherwise, there are an even number of errors therein. The described error correction capability is dependent on the packet length, the number of error bits and the error bit distribution, the CRC size, and the CRC generator polynomial G(x).

In one embodiment, the invention provides an FEC technique that uses a CRC error syndrome in a BLE receiver that corrects single-bit errors, 2-bit errors, 3-bit errors where at least 2 errors are in burst mode (i.e., errors occur in consecutive bits), and 4-bit errors consisting of two 2-bit bursts (errors in consecutive bits). These particular error patterns are selected because they represent the majority of errors occurring in a BLE receiver using MLSE (Maximum Likelihood Sequence Estimation) decoder in a AWGN (All White Noise Gaussian Noise) channel with moderate SNR (Signal to Noise Ratio). These errors are uniquely identified by the calculated CRC error syndrome.

The described CRC-based FEC system can be used to add powerful error correction capability to systems that operate according to existing communication standards which do not explicitly support FEC without incurring the cost of additional FEC circuitry encoding/decoding overhead or "bandwidth "overhead". The described embodiments of the invention use whatever CRC capability is already present in a digital receiver to accomplish error detection in order to provide error correction capability in addition to the already-existing error detection capability and thereby substantially reduce the probability of required retransmissions which cause additional delay, spectrum usage, and "overhead" power consumption. No change is required for existing transmitters, and only relatively simple, inexpensive modifications are required for conventional existing digital receivers.

The described BLE receiver enhanced with the CRC-based error correction capability in accordance with the present invention remains in compliance with the BLE standard and can communicate with any BLE transmitter that is in compliance with the BLE standard. A key advantage of introducing CRC based error correction in accordance with the present invention is that it requires no change in the applicable communication standard and it may be added to any digital receiver that uses CRC for error detection. If the communication standard specifies FEC capability, the CRC based error correction may be implemented to further improve the error correction capability of the receiver.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, communication systems that have conventional FEC (forward error correction) capability (but not CRC-based error correction) typically have "residual errors" which they are incapable of correcting. Such systems typically use CRC techniques after the FEC process to detect such residual errors. It is believed that the CRC-based error correction techniques in accordance with the present invention may be utilized to correct such residual errors. As another example, although prototypes of the described invention have been implemented for BLE systems and ANT systems, the described CRC based FEC system could be applied to many other digital receivers such as those in as Zigbee and Body Area Network systems, and those in USB power delivery system. (ANT is a Wireless Personal Network protocol, by Dynastream Innovations Inc., with small size, reasonable cost and very low power requirements.)

What is claimed is:

1. A communication system comprising:
   (a) digital transmitter circuitry including
      1) a CRC (cyclic redundancy check) generator circuit for receiving a message and generating a first CRC code based on the message and appending the first CRC code to the message to provide a first data packet, and
      2) circuitry for transforming the message and the first CRC code in the first data packet to provide a second data packet in a form suitable for transmission and for transmitting the second data packet; and
   (b) digital receiver circuitry including
      1) circuitry for receiving the transmitted second data packet,
      2) a CRC verification circuit for comparing a received digital CRC code portion of the second data packet to a calculated digital CRC code portion of the second data packet including any error introduced into a message portion of the received second data packet by the digital transmitter circuitry or by the digital receiver circuitry to detect existence of any error in the second data packet, and presenting the message for further processing if no error is detected, and 3) a CRC-based FEC (forward error correction) circuit for receiving the message portion from the CRC verification circuit if an error is detected, attempting to correct the detected error without use of parity bits based on a determination of whether the detected error affects an even number of bits or an odd number of bits, and indicating that the detected error is uncorrectable if the attempt to correct that error is unsuccessful.

2. The communication system of claim 1 wherein the comparing includes performing an exclusive OR function on the received digital CRC code portion of the second data packet to the calculated digital CRC code portion of the second data packet.

3. The communication system of claim 1 wherein the digital transmitter circuitry converts the second data packet to generate an analog RF signal and wirelessly transmits the analog RF signal to the digital receiver circuitry.

4. The communication system of claim 3 wherein the digital receiver circuitry converts digital symbols represented by a received analog RF signal to provide a digital representation of the second data packet.

5. The communication system of claim 1 wherein the second data packet is transmitted from the digital transmitter circuitry to the digital receiver circuitry by means of a cable.

6. The communication system of claim 5 wherein the digital transmitter circuitry includes a transmitter digital baseband circuit for transforming information in the first digital packet into digital symbols and digitizing circuitry for digitizing the digital symbols to prepare them for conversion into the analog RF signal.

7. The communication system of claim 6 wherein the digital receiver circuit includes a receiver digital baseband circuit for converting the received analog RF signal into a digital signal and operating on that digital signal to recover the digital symbols and convert them into a binary format for the CRC code verification circuit.

8. The communication system of claim 7 wherein the digital symbols include groups of bits in hexadecimal format.

9. The communication system of claim 1 wherein the CRC generator circuit generates the first CRC code based on a 24-bit generator polynomial G(x).

10. The communication system of claim 9 wherein the generator polynomial is given by the expression $G(x)=x^{24}+x^{10}+x^9+x^6+x^4+x^3+x+1$.

11. The communication system of claim 1 wherein the CRC-based FEC circuit operates
(1) in response to a CRC error syndrome equal to an exclusive OR function of a received CRC and a calculated CRC,
(2) to determine if the detected error affects an even number of bits or an odd number of bits;
(3) if the detected error affects an even number of bits, to compute a syndrome patch for the even number of bits;
(4) if the syndrome patch is equal to 0, to correct a detected error by flipping a corresponding bit in the message, and if the syndrome patch is never equal to 0 for all possible even number error patterns within an error correction capacity of the CRC-based FEC circuit to indicate that the detected error is not correctable;
(5) if the detected error affects an odd number of bits, to compute a syndrome patch for the odd number of bits; and
(6) if the syndrome patch is equal to 0, to correct a detected error by flipping a corresponding bit in the message, and if the syndrome patch is never equal to 0 for all possible odd number error patterns within the error correction capacity, to indicate that the error is not correctable.

12. The communication system of claim 11 wherein the CRC-based FEC circuit operates to compute the syndrome patch equal to the exclusive OR function of the CRC error syndrome and a patched value of the CRC error syndrome corresponding to a predetermined group of erroneous bits.

13. The communication system of claim 11 wherein the CRC-based FEC circuit operates to determine whether another erroneous message bit needs to be corrected.

14. The communication system of claim 1 wherein the digital transmitter circuitry is included in a master unit in a BLE (Bluetooth low energy) network and the digital receiver circuitry is included in a slave unit in the BLE network.

15. A CRC (cyclic redundancy check) method for accomplishing FEC (forward error correction) in a communication system including digital transmitter circuitry and digital receiver circuitry, the method comprising:
(a) operating a CRC (cyclic redundancy check) generator circuit in the digital transmitter circuitry on a received message to generate a first CRC code based on the message, appending the first CRC code to the message to provide a first data packet, transforming the message and the first CRC code in the first data packet to provide a second data packet in a form suitable for transmission, and transmitting the second data packet;
(b) operating circuitry in the digital receiver circuitry to receive the transmitted second data packet;
(c) operating a CRC verification circuit to compare a received first digital CRC code portion of the second data packet with a calculated digital CRC code based on a message portion of the second data packet possibly including an error introduced by the digital transmitter circuitry or by the digital receiver circuitry to detect existence of any error in the message portion of the second data packet, and presenting the message portion of the second data packet for further processing if no error is detected; and
(d) operating a CRC-based FEC (forward error correction) circuit if an error is detected to attempt to correct the detected error without use of parity bits, and indicating that the detected error is uncorrectable if the attempt to correct it is unsuccessful, wherein said attempt to correct the detected error is based on a determination of whether the detected error affects an even number of bits or an odd number of bits.

16. The method of claim 15 wherein the comparing includes performing an exclusive OR function on the received first digital CRC code portion of the second data packet to the calculated digital CRC code portion of the second data packet.

17. The method of claim 15 including operating the digital transmitter circuitry to transform the second data packet to an analog RF signal, and wirelessly transmitting the analog RF signal to the digital receiver circuitry.

18. The method of claim 15 including,
if the detected error affects an even number of bits, computing a syndrome patch for the even number of bits, and
if that syndrome patch is equal to 0, correcting a detected error by flipping a corresponding bit in the message portion of the second data packet, and if that syndrome patch is not equal to 0, using a different even number of possible error bits to re-calculate the syndrome patch, and if the syndrome patch is never equal to 0 after all possible even number error bit patterns within an error correction capability range of the CRC-based FEC circuit, indicating that detected error is not correctable; and the method also including, if the detected error affects an odd number of bits, computing a syndrome patch for the odd number of bits, and if that syndrome patch is equal to 0, correcting a detected error by flipping a corresponding bit in the message portion of the second data packet, and if that syndrome patch is not equal to 0, using a different odd number of possible error bits to re-calculate the syndrome patch, and if the syndrome patch is never equal to 0 after all possible odd number error bit patterns within an error correction capability range of the CRC-based FEC circuit, indicating that detected error is not correctable.

19. The method of claim 15 wherein the digital transmitter circuitry is included in a master unit in a BLE (Bluetooth low energy) network and the digital receiver circuitry is included in a slave unit in the BLE network.

* * * * *